(12) United States Patent
Akiyama

(10) Patent No.: US 8,405,180 B2
(45) Date of Patent: Mar. 26, 2013

(54) SOLID-STATE IMAGING DEVICE, METHOD OF MAKING THE SAME, AND IMAGING APPARATUS

(75) Inventor: Kentaro Akiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/242,557

(22) Filed: Sep. 23, 2011

(65) Prior Publication Data

US 2012/0008026 A1    Jan. 12, 2012

Related U.S. Application Data

(63) Continuation of application No. 11/945,717, filed on Nov. 27, 2007, now Pat. No. 8,039,914.

(30) Foreign Application Priority Data

Dec. 8, 2006 (JP) .................................. 2006-331559

(51) Int. Cl.
*H01L 31/0232* (2006.01)

(52) U.S. Cl. ... 257/432; 257/98; 257/435; 257/E31.127; 257/E33.072; 257/E21.527

(58) Field of Classification Search .................... 257/98, 257/432, 435, E31.127, E33.072, E21.527
See application file for complete search history.

(56) References Cited

FOREIGN PATENT DOCUMENTS

| JP | 02-264473 | 10/1990 |
|---|---|---|
| JP | 03-153075 | 7/1991 |
| JP | 2006-120805 | 7/1991 |
| JP | 03-257868 | 11/1991 |
| JP | 06-104414 | 4/1994 |
| JP | 09-121305 | 5/1997 |
| JP | 2003-324189 | 11/2003 |
| JP | 2005-353874 | 12/2005 |
| JP | 2006-261372 | 9/2006 |
| JP | 2006-310650 | 11/2006 |
| JP | 2008-147333 | 6/2008 |
| JP | 4525671 | 6/2010 |
| WO | 2006/038353 | 4/2006 |

OTHER PUBLICATIONS

Japanese Office Action issued on Jul. 17, 2012, in connection with counterpart JP Application No. 2010-095487.
Japanese Office Action issued on Jul. 17, 2012, in connection with counterpart JP Application No. 2010-095488.
Japanese Office Action issued on Jul. 17, 2012, in connection with counterpart JP Application No. 2010-095489.

*Primary Examiner* — N Drew Richards
*Assistant Examiner* — Joannie A Garcia
(74) *Attorney, Agent, or Firm* — SNR Denton US LLP

(57) ABSTRACT

A solid-state imaging device includes the following elements. A photoelectric conversion section is arranged in a semiconductor layer having a first surface through which light enters the photoelectric conversion section. A signal circuit section is arranged in a second surface of the semiconductor layer opposite to the first surface. The signal circuit section processes signal charge obtained by photoelectric conversion by the photoelectric conversion section. A reflective layer is arranged on the second surface of the semiconductor layer opposite to the first surface. The reflective layer reflects light transmitted through the photoelectric conversion section back thereto. The reflective layer is composed of a single tungsten layer or a laminate containing a tungsten layer.

9 Claims, 8 Drawing Sheets

SOLID-STATE IMAGING DEVICE, METHOD OF MAKING THE SAME, AND IMAGING APPARATUS

RELATED APPLICATION DATA

This application is a continuation of U.S. patent application Ser. No. 11/945,717, filed Nov. 27, 2007 now U.S. Pat. No. 8,039,914, the entirety of which is incorporated herein by reference to the extent permitted by law. The present application claims the benefit of priority to Japanese Patent Application No. 2006-331559 filed in the Japanese Patent Office on Dec. 8, 2006, the entirety of which is incorporated by reference herein to the extent permitted by law.

BACKGROUND OF THE INVENTION

1. Field of the Invention

The present invention relates to a back-illuminated solid-state imaging device, a method of making the same, and an imaging apparatus including the solid-state imaging device.

2. Description of the Related Art

Referring to FIG. 8, a back-illuminated solid-state imaging device includes a silicon substrate 211, in which photodiodes 221 are arranged, and a signal circuit section 231. Light is incident on a first surface of the silicon substrate 211. The signal circuit section 231 is arranged in a second surface of the silicon substrate 211. Assuming that the thickness of a silicon layer in a portion corresponding to each photodiode 221 is several micrometers or less, incident light components having long wavelengths are not sufficiently absorbed by the photodiodes 221 and are transmitted to the signal circuit section 231 in the second surface of the silicon substrate 211. Particularly, light components having long wavelengths (e.g., red wavelengths) are transmitted in a portion corresponding to each photodiode 221 and the transmitted light components enter the signal circuit section 231. Disadvantageously, it is difficult to efficiently convert light in a long wavelength range (hereinafter, long-wavelength light) into an electrical signal. Furthermore, the transmitted light is reflected by an interconnection laminate 233 in the signal circuit section 231, so that the reflected light is incident on the photodiodes in surrounding pixels, leading to crosstalk. Unfortunately, the occurrence of crosstalk causes a problem. For example, Japanese Unexamined Patent Application Publication No. 2006-261372 discloses a related-art solid-state imaging device having a structure in which a polysilicon layer and an aluminum layer are arranged on photodiodes. In this structure, it is insufficient to shield against long-wavelength light components, such as infrared light and near-infrared light. Particularly, the amount of transmitted light in the polysilicon layer is large. The aluminum layer is formed by grain growth. Disadvantageously, light is leaked from grain boundaries, thus reducing the reflectance.

SUMMARY OF THE INVENTION

Problems to be solved include the difficulty to efficiently convert long-wavelength light transmitted through each photoelectric conversion section (e.g., each photodiode) into electrical signals and an insufficient effect in shielding light, particularly, long-wavelength light, the effect being produced by arranging the polysilicon layer and the aluminum layer for light reflection on one surface of each photodiode opposite to the other surface on which light is incident.

It is desirable to improve sensitivity while efficiently converting long-wavelength light transmitted through each photodiode into electrical signals.

According to an embodiment of the present invention, a solid-state imaging device includes the following elements. A photoelectric conversion section is arranged in a semiconductor layer having a first surface through which light enters the photoelectric conversion section. A signal circuit section is arranged in a second surface of the semiconductor layer opposite to the first surface thereof. The signal circuit section processes signal charge obtained by photoelectric conversion by the photoelectric conversion section. A reflective layer is arranged on the second surface of the semiconductor layer opposite to the first surface. The reflective layer reflects light transmitted through the photoelectric conversion section back thereto. The reflective layer is composed of a single tungsten layer or a laminate containing a tungsten layer.

According to this embodiment, the reflective layer that reflects light transmitted through the photoelectric conversion section back thereto is arranged on the second surface of the semiconductor layer opposite to the first surface through which light enters the photoelectric conversion section. If light entering the photoelectric conversion section is not completely absorbed by the photoelectric conversion section, the reflective layer can reflect the transmitted light, particularly, long-wavelength light components, such as near-infrared light and infrared light, which are easily transmitted through the photoelectric conversion section, back to the photoelectric conversion section. In other words, light which has been transmitted once through the photoelectric conversion section can be received again by the photoelectric conversion section. Consequently, the amount of light, in particular, long-wavelength light components, received by the photoelectric conversion section can be substantially increased. Advantageously, the sensitivity of the photoelectric conversion section to long-wavelength light components can be improved. Since the reflective layer is composed of the single tungsten layer or the laminate containing the tungsten layer, the density of the reflective layer is higher than that of a reflective layer including an aluminum layer formed by grain growth. Accordingly, this high-density reflective layer can reflect long-wavelength light components, particularly, near-infrared light and infrared light. Furthermore, among light incident on the first surface of the semiconductor layer, light components which are not absorbed by the photoelectric conversion section are reflected back to the photoelectric conversion section by the reflective layer on the second surface in which the signal circuit section is arranged, thus preventing crosstalk caused by the leakage of light into surrounding pixels.

According to another embodiment of the present invention, a method of making a solid-state imaging device includes the steps of (a) forming a photoelectric conversion section in a semiconductor layer having a first surface through which light enters the photoelectric conversion section, and (b) forming a signal circuit section in a second surface of the semiconductor layer opposite to the first surface, the signal circuit section including transistors for extracting an electrical signal obtained by photoelectric conversion by the photoelectric conversion section. The step (b) includes the substep of forming a contact portion connected to each transistor in the signal circuit section. In the substep, a reflective layer is formed on the second surface of the semiconductor layer opposite to the first surface, the reflective layer reflecting light transmitted through the photoelectric conversion section back thereto and being composed of a single tungsten layer or a laminate containing a tungsten layer.

According to this embodiment, in the substep of forming a contact portion connected to each transistor in the signal circuit section, the reflective layer that reflects light transmitted through the photoelectric conversion section back thereto is formed on the second surface of the semiconductor layer opposite to the first surface. Accordingly, if light entering the photoelectric conversion section is not completely absorbed by the photoelectric conversion section, particularly, long-wavelength light components, such as near-infrared light and infrared light, which are easily transmitted through the photoelectric conversion section, can be reflected back to the photoelectric conversion section by the reflective layer. In other words, light which has been transmitted once through the photoelectric conversion section can be received again by the photoelectric conversion section. Consequently, the amount of light, in particular, long-wavelength light components, received by the photoelectric conversion section can be substantially increased. Advantageously, the solid-state imaging device in which the sensitivity of the photoelectric conversion section to long-wavelength light components is improved can be made. Since the reflective layer is composed of the single tungsten layer or the laminate containing the tungsten layer, the density of the reflective layer is higher than that of a reflective layer including an aluminum layer formed by grain growth. Accordingly, this high-density reflective layer can reflect long-wavelength light components, particularly, near-infrared light and infrared light. Furthermore, among light incident on the first surface of the semiconductor layer, light components which are not absorbed by the photoelectric conversion section are reflected back to the photoelectric conversion section by the reflective layer on the second surface in which the signal circuit section is arranged. Consequently, the solid-state imaging device which prevents crosstalk caused by the leakage of light into surrounding pixels can be made.

According to another embodiment of the present invention, an imaging apparatus includes the following elements. A collection optical unit collects incident light. A solid-state imaging device receives the light collected by the collection optical unit and converts the light into an electrical signal. A signal processing unit processes the electrical signal. The solid-state imaging device includes the following elements. A photoelectric conversion section is arranged in a semiconductor layer having a first surface through which light enters the photoelectric conversion section. A signal circuit section is arranged in a second surface of the semiconductor layer opposite to the first surface. The signal circuit section extracts the electric signal obtained by the photoelectric conversion section. A reflective layer is arranged on the second surface of the semiconductor layer opposite to the first surface. The reflective layer reflects light transmitted through the photoelectric conversion section back thereto. The reflective layer is composed of a single tungsten layer or a laminate containing a tungsten layer.

According to this embodiment, the imaging apparatus includes the solid-state imaging device according to the foregoing embodiment. As described above, in the imaging apparatus, the sensitivity is high and crosstalk can be prevented.

According to the embodiment first described above, the solid-state imaging device having the following advantages can be realized. Since the reflective layer that reflects light transmitted through the photoelectric conversion section back thereto and is composed of the single tungsten layer or the laminate containing the tungsten layer is arranged on the second surface of the semiconductor layer opposite to the first surface through which light enters the photoelectric conversion section, the sensitivity of the photoelectric conversion section to long-wavelength light components can be improved to obtain high sensitivity and prevent crosstalk. The amount of light entering the photoelectric conversion section can be increased to provide a high dynamic range.

According to the embodiment second described above, the solid-state imaging device having the following advantages can be made. Since the reflective layer that reflects light transmitted through the photoelectric conversion section back thereto and is composed of the single tungsten layer or the laminate layer containing the tungsten layer is arranged on the second surface of the semiconductor layer opposite to the first surface through which light enters the photoelectric conversion section, the sensitivity of the photoelectric conversion section to long-wavelength light components can be improved to obtain high sensitivity and prevent crosstalk. The amount of light entering the photoelectric conversion section can be increased to provide a high dynamic range.

According to the embodiment third described above, since the imaging apparatus includes the solid-state imaging device according to the foregoing embodiment, the same advantages as those described above can be obtained.

DESCRIPTION OF THE PREFERRED EMBODIMENTS

A solid-state imaging device 1 according to an embodiment (first embodiment) of the present invention will now be described with reference to FIG. 1 which is a schematic cross-sectional view of the solid-state imaging device 1.

Figure 1:
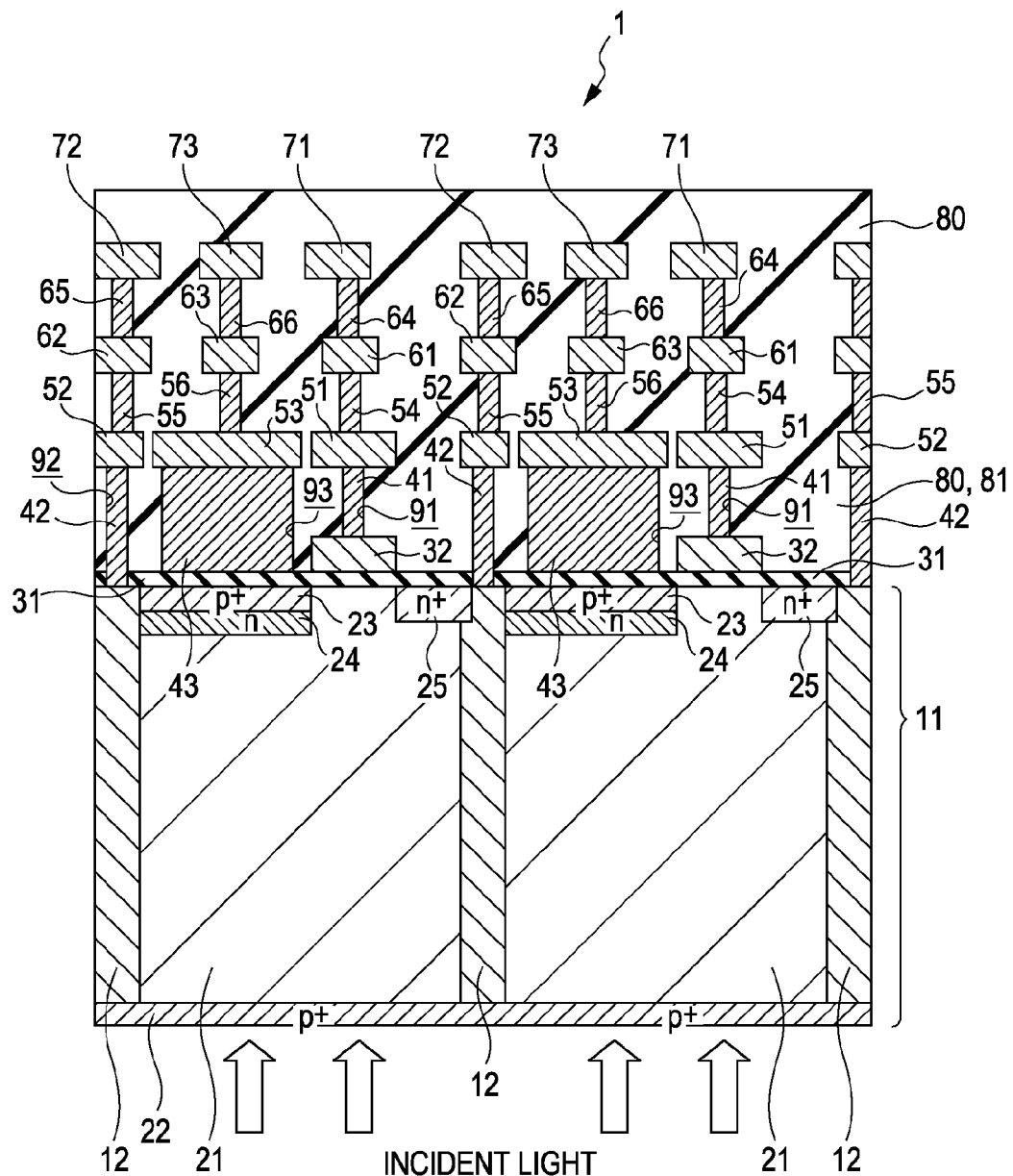
FIG. 1 is a schematic cross-sectional view of a solid-state imaging device according to an embodiment (first embodiment) of the present invention.

Referring to FIG. 1, pixel isolation regions 12 for isolating a pixel are arranged in a semiconductor layer 11. The semiconductor layer 11 includes, for example, a silicon layer or a silicon substrate. Each pixel isolation region 12 includes, for example, a p-type well region. In each area partitioned by the pixel isolation regions 12, a photoelectric conversion section 21 is arranged. On a first surface, through which light enters, of each photoelectric conversion section 21 (the lower surface of the photoelectric conversion section 21 in FIG. 1), i.e., in a first surface of the semiconductor layer 11 through which light enters the photoelectric conversion section 21, a hole storage layer 22 is arranged. The hole storage layer 22 includes, for example, a p+ region. A second surface of the photoelectric conversion section 21 (the upper surface of the photoelectric conversion section 21 in FIG. 1) opposite to the first surface thereof, i.e., a second surface of the semiconductor layer 11 opposite to the first surface thereof includes a hole storage layer 23. Under the hole storage layer 23, an n-type well region 24 is arranged. The hole storage layer 23 includes, for example, a p+ region. In addition, a gate electrode (for example, a transfer gate) 32 is arranged over the second surface of the photoelectric conversion section 21, with a gate insulation layer 31 therebetween. In the semiconductor layer 11, an n+ region 25 is arranged adjacent to one end of the gate electrode 32, with the gate insulation layer 31 therebetween.

A contact portion 41 is connected to each gate electrode 32. Another contact portion 42 is connected to each pixel isolation region 12. A reflective layer 43, serving as a contact portion similar to the contact portions 41 and 42, is arranged over each photoelectric conversion section 21, with the gate insulation layer 31 therebetween. In addition, contact portions connected to other transistors, for example, gate electrodes and source and drain regions in a signal circuit section (not shown) are arranged. The gate insulation layer 31 and the gate electrodes 32 are overlaid with an insulation layer 81. The above-described contact portions are formed by filling holes 91, 92, and 93 arranged in the insulation layer 81 with, for example, a conductive material.

The reflective layer 43 has to reflect light transmitted through each photoelectric conversion section 21 toward the section 21. Accordingly, the reflective layer 43 includes a material that reflects long-wavelength light components, such as near-infrared light and infrared light, toward the photoelectric conversion section 21. The reflective layer 43 may reflect shorter-wavelength light components, such as visible light, near-ultraviolet light, and ultraviolet light, in addition to the long-wavelength light components. Examples of the materials having the above-described characteristics include tungsten. It is therefore preferred that the reflective layer 43 be composed of a single tungsten layer. Alternatively, it is preferred that the reflective layer 43 be composed of a laminate containing a tungsten layer. Examples of the laminates include a laminate containing a polysilicon layer and a tungsten layer and a laminate including a tungsten layer and a silicide layer.

Since the reflective layer 43 includes the tungsten layer, light transmitted through the photoelectric conversion section 21 can be reflected toward the photoelectric conversion section 21. The tungsten layer is formed without grain growth for an aluminum layer used in the related art. Accordingly, grain boundaries are hardly generated. Consequently, the reflective layer 43 can reflect long-wavelength light components, such as near-infrared light and infrared light, which leak from grain boundaries in the aluminum layer.

Further, first interconnection lines 51 to 53 respectively connected to the contact portions 41 and 42 and the reflective layer 43 are arranged. It is preferred that each first interconnection line 53 connected to the reflective layer 43 have a shape larger than, for example, the shape of the reflective layer 43 in plan view. Further, it is preferred that the first interconnection lines 51 and 52 be composed of, for example, tungsten. The first interconnection lines 51 and 52 may be composed of another metallic material, e.g., copper or aluminum. For example, when the first interconnection lines 51 to 53 are formed using tungsten, light which is not reflected by the reflective layer 43, for example, long-wavelength light components leaking from the periphery of each area corresponding to the reflective layer 43 can be reflected toward the corresponding photoelectric conversion section 21 by the first interconnection lines 51 to 53.

Each first interconnection line 51 is connected to a second interconnection line 51 through a via hole 54. Each first interconnection line 52 is connected to a second interconnection line 62 through a via hole 55. Each first interconnection line 53 is connected to a second interconnection line 63 through a via hole 56. Similarly, each second interconnection line 61 is connected to a third interconnection line 71 through a via hole 64. Each second interconnection line 62 is connected to a third interconnection line 72 through a via hole 65. Each second interconnection line 63 is connected to a third interconnection line 73 through a via hole 66. The solid-state imaging device 1 of FIG. 1 includes an interconnection laminate having three interconnection layers. The present embodiment of the invention may be applied to a solid-state imaging device including an interconnection laminate having four or more interconnection layers. An insulation layer 80, including the insulation layer 81, is arranged so as to cover the above-described interconnection layers. The insulation layer 80 includes a plurality of insulation sublayers in accordance with the arrangement state of interconnection. The second surface of the semiconductor layer 11 is overlaid with the signal circuit section (not shown) which includes transistors, such as transfer transistors, reset transistors, and amplifier transistors, and the interconnection laminate including the first interconnection lines 51 to 53, the via holes 54 to 56, the second interconnection lines 61 to 63, the via holes 64 to 66, and the third interconnection lines 71 to 73.

In the solid-state imaging device 1 according to the first embodiment, the reflective layer 43 for reflecting light transmitted through each photoelectric conversion section 21 toward the section 21 is arranged adjacent to the second surface of the photoelectric conversion section 21 opposite to the first surface thereof, i.e., the second surface of the semiconductor layer 11 opposite to the first surface thereof. If light entering the photoelectric conversion section 21 is not completely absorbed by the photoelectric conversion section 21, particularly, long-wavelength light components that are easily transmitted through each photoelectric conversion section 21, e.g., near-infrared light and infrared light can be reflected back to the photoelectric conversion section 21 by the reflective layer 43. In other words, light transmitted once through the photoelectric conversion section 21 can be received again by the photoelectric conversion section 21. Consequently, the amount of, particularly, long-wavelength light components received by the photoelectric conversion section 21 is substantially increased. Thus, the sensitivity of the photoelectric conversion section 21 to long-wavelength light components can be improved. Since the reflective layer 43 is composed of the single tungsten layer or the laminate containing the tungsten layer, the density of the reflective layer 43 is higher than that of an aluminum layer formed by grain growth. Accordingly, the reflective layer 43 can reflect, in particular, long-wavelength light components, such as near-infrared light and infrared light. Furthermore, among light incident on the first surface of the semiconductor layer 11 (i.e., the first surface of the photoelectric conversion section 21), light components which are not absorbed by each photoelectric conversion section 21 are reflected back to the photoelectric conversion section 21 by the reflective layer 43 included in the signal circuit section in the second surface of the semiconductor layer 11, thus preventing crosstalk caused by the leakage of light into surrounding pixels.

To make the solid-state imaging device 1 according to the first embodiment, the contact portion 41 is formed on each gate electrode 32 and the contact portion 42 is formed on each pixel isolation region 12. Simultaneously, the reflective layer 43, serving as a contact portion similar to those contact portions 41 and 42, may be formed over each photoelectric conversion section 21, with the gate insulation layer 31 therebetween. For example, the holes 91 and 92 in the insulation layer 81 are filled with tungsten to form the contact portions 41 and 42. Simultaneously, the hole 93 in the insulation layer 81 over each photoelectric conversion section 21 is filled with tungsten, thus forming the reflective layer 43.

A solid-state imaging device 2 according to an embodiment (second embodiment) of the present invention will now be described with reference to FIG. 2, which is a schematic cross-sectional view of the solid-state imaging device 2. The second embodiment relates to an example of a countermeasure against a problem that it is difficult to fill the hole 93 for the reflective layer 43 with tungsten in accordance with the first embodiment when the diameter of the hole 93 is large.

Figure 2:
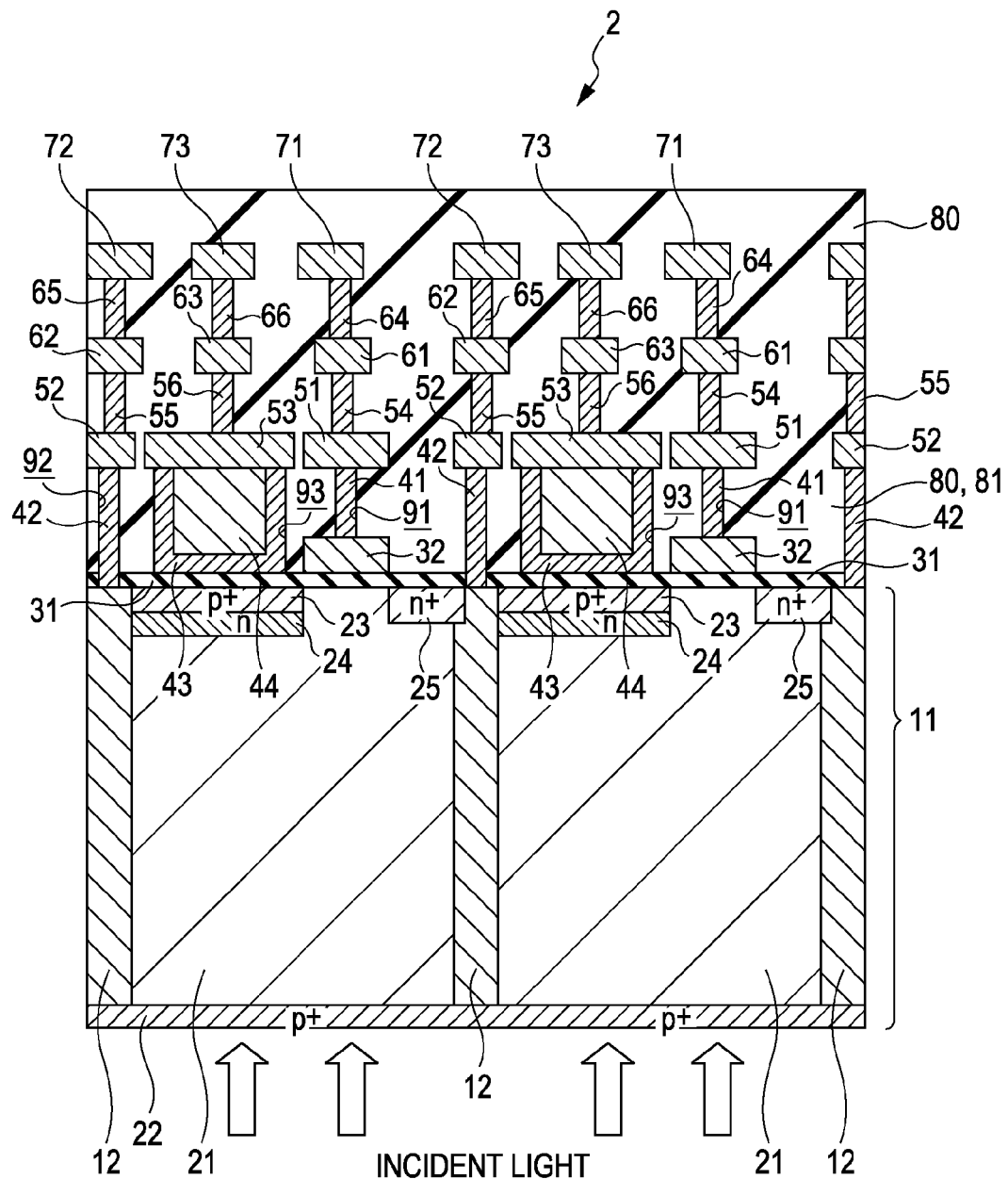
FIG. 2 is a schematic cross-sectional view of a solid-state imaging device according to an embodiment (second embodiment) of the present invention.

Referring to FIG. 2, pixel isolation regions 12 for isolating a pixel are arranged in a semiconductor layer 11. The semiconductor layer 11 includes, for example, a silicon layer. Each pixel isolation region 12 includes, for example, a p-type well region. In each area partitioned by the pixel isolation regions 12, a photoelectric conversion section 21 is arranged. On a first surface, through which light enters, of each photoelectric conversion section 21 (the lower surface of the photoelectric conversion section 21 in FIG. 2), i.e., in a first surface of the semiconductor layer 11 through which light enters the photoelectric conversion section 21, a hole storage layer 22 is arranged. The hole storage layer 22 includes, for example, a p+ region. A second surface of the photoelectric conversion section 21 (the upper surface of the photoelectric conversion section 21 in FIG. 2) opposite to the first surface thereof, i.e., a second surface of the semiconductor layer 11 opposite to the first surface thereof includes a hole storage layer 23. Under the hole storage layer 23, an n-type well region 24 is arranged. The hole storage layer 23 includes, for example, a p+ region. In addition, a gate electrode (for example, a transfer gate) 32 is arranged over the second surface of the photoelectric conversion section 21, with a gate insulation layer 31 therebetween. In the semiconductor layer 11, an n+ region 25 is arranged adjacent to one end of the gate electrode 32, with the gate insulation layer 31 therebetween.

A contact portion 41 is connected to each gate electrode 32. Another contact portion 42 is connected to each pixel isolation region 12. A reflective layer 43, serving as a contact portion similar to the contact portions 41 and 42, is arranged over each photoelectric conversion section 21, with the gate insulation layer 31 therebetween. In addition, contact portions connected to other transistors, for example, gate electrodes and source and drain regions in a signal circuit (not shown) are arranged. The gate insulation layer 31 and the gate electrodes 32 are overlaid with an insulation layer 81. The above-described contact portions are formed by filling holes arranged in the insulation layer 81 with, for example, a conductive material. To form the reflective layer 43 in a manner similar to those contact portions, it is difficult to fill a hole 93 because the diameter of the hole 93 is large. Therefore, the reflective layer 43 is arranged so as to cover the inner surface of the hole 93.

The reflective layer 43 includes a material that reflects light transmitted through each photoelectric conversion section 21 toward the section 21. For example, the reflective layer 43 includes a material that reflects long-wavelength light components, e.g., at least near-infrared light and infrared light, toward the photoelectric conversion section 21. The reflective layer 43 may reflect shorter-wavelength light components, such as visible light, near-ultraviolet light, and ultraviolet light, in addition to the long-wavelength light components.

Examples of the materials having the above-described characteristics include tungsten. It is therefore preferred that the reflective layer 43 be composed of a single tungsten layer. Alternatively, it is preferred that the reflective layer 43 be composed of a laminate containing a tungsten layer. Examples of the laminates include a laminate including a polysilicon layer and a tungsten layer and a laminate including a tungsten layer and a silicide layer. The reflective layer 43 arranged so as to cover the inner surface of the hole 93 has to have a thickness sufficient to prevent long-wavelength light components, such as near-infrared light and infrared light, from being transmitted through the reflective layer 43.

Since the reflective layer 43 includes the tungsten layer, light transmitted through the photoelectric conversion section 21 can be reflected toward the photoelectric conversion section 21. The tungsten layer is formed without grain growth for an aluminum layer used in the related art. Accordingly, grain boundaries are hardly generated. Consequently, the reflective layer 43 can reflect long-wavelength light components, such as near-infrared light and infrared light, which leak from grain boundaries in the aluminum layer.

Each hole 93 is filled with a material 44, serving as an insulation layer or a conductive layer, with the reflective layer 43 therebetween. Since the hole 93 is filled with the material 44 as described above, there is no step in the hole 93.

Further, first interconnection lines 51 to 53 respectively connected to the contact portions 41 and 42 and the reflective layer 43 are arranged. It is preferred that each first interconnection line 53 connected to the reflective layer 43 have a shape larger than, for example, the shape of the reflective layer 43 in plan view. Further, it is preferred that the first interconnection lines 51 and 52 be composed of, for example, tungsten. The first interconnection lines 51 and 53 may be composed of another metallic material, e.g., copper or aluminum. For example, when the first interconnection lines 51 to 53 are formed using tungsten, light which is not completely reflected by the reflective layer 43, for example, long-wavelength light components leaking from the periphery of each area corresponding to the reflective layer 43 can be reflected toward the corresponding photoelectric conversion section 21 by the first interconnection lines 51 to 53.

Each first interconnection line 51 is connected to a second interconnection line 51 through a via hole 54. Each first interconnection line 52 is connected to a second interconnection line 62 through a via hole 55. Each first interconnection line 53 is connected to a second interconnection line 63 through a via hole 56. Similarly, each second interconnection line 61 is connected to a third interconnection line 71 through a via hole 64. Each second interconnection line 62 is connected to a third interconnection line 72 through a via hole 65. Each second interconnection line 63 is connected to a third interconnection line 73 through a via hole 66. The solid-state imaging device 2 of FIG. 2 includes an interconnection laminate having three interconnection layers. The present embodiment of the invention may be applied to a solid-state imaging device including an interconnection laminate having four or more interconnection layers. An insulation layer 80, including the insulation layer 81, is arranged so as to cover the above-described interconnection layers. The insulation layer 80 includes a plurality of insulation sublayers in accordance with the arrangement state of interconnection. The second surface of the semiconductor layer 11 is overlaid with the signal circuit section (not shown) which includes transistors, such as transfer transistors, reset transistors, and amplifier transistors, and the interconnection laminate including the first interconnection lines 51 to 53, the via holes 54 to 56, the second interconnection lines 61 to 63, the via holes 64 to 66, and the third interconnection lines 71 to 73.

In the solid-state imaging device 2 according to the second embodiment, the reflective layer 43 for reflecting light transmitted through each photoelectric conversion section 21 toward the section 21 is arranged adjacent to the second surface of the photoelectric conversion section 21 opposite to the first surface thereof, i.e., the second surface of the semiconductor layer 11 opposite to the first surface thereof. If light entering the photoelectric conversion section 21 is not completely absorbed by the photoelectric conversion section 21, particularly, long-wavelength light components that are easily transmitted through each photoelectric conversion section 21, e.g., near-infrared light and infrared light can be reflected back to the photoelectric conversion section 21 by the reflective layer 43. In other words, light transmitted once through the photoelectric conversion section 21 can be received again by the photoelectric conversion section 21. Consequently, the amount of, particularly, long-wavelength light components received by the photoelectric conversion section 21 is substantially increased. Thus, the sensitivity of the photoelectric conversion section 21 to long-wavelength light components can be improved. Since the reflective layer 43 is composed of the single tungsten layer or the laminate containing the tungsten layer, the density of the reflective layer 43 is higher than that of an aluminum layer formed by grain growth. Accordingly, the reflective layer 43 can reflect, in particular, long-wavelength light components, such as near-infrared light and infrared light. Furthermore, among light incident on the first surface of the semiconductor layer 11 (i.e., the first surface of the photoelectric conversion section 21), light components which are not absorbed by each photoelectric conversion section 21 are reflected back to the photoelectric conversion section 21 by the reflective layer 43 included in the signal circuit section in the second surface of the semiconductor layer 11, thus preventing crosstalk caused by the leakage of light into surrounding pixels.

To make the solid-state imaging device 2 according to the second embodiment, the contact portion 41 is formed on each gate electrode 32 and the contact portion 42 is formed on each pixel isolation region 12. Simultaneously, the reflective layer 43, serving as a contact portion similar to those contact portions 41 and 42, may be formed over each photoelectric conversion section 21, with the gate insulation layer 31 therebetween. Since it is difficult to completely fill the hole 93 with a material for the reflective layer 43, a space on the reflective layer 43 in the hole 93 is filled with the material 44, serving as an insulation layer or a conductive layer. For example, holes 91 and 92 in the insulation layer 81 are filled with tungsten to form the contact portions 41 and 42. Simultaneously, a tungsten layer is disposed in the hole 93 in the insulation layer 81 over each photoelectric conversion section 21, thus forming the reflective layer 43. Subsequently, a space on the reflective layer 43 in the hole 93 is filled with the material 44, serving as an insulation layer or a conductive layer, and the surplus material 44 is removed.

Figure 3:
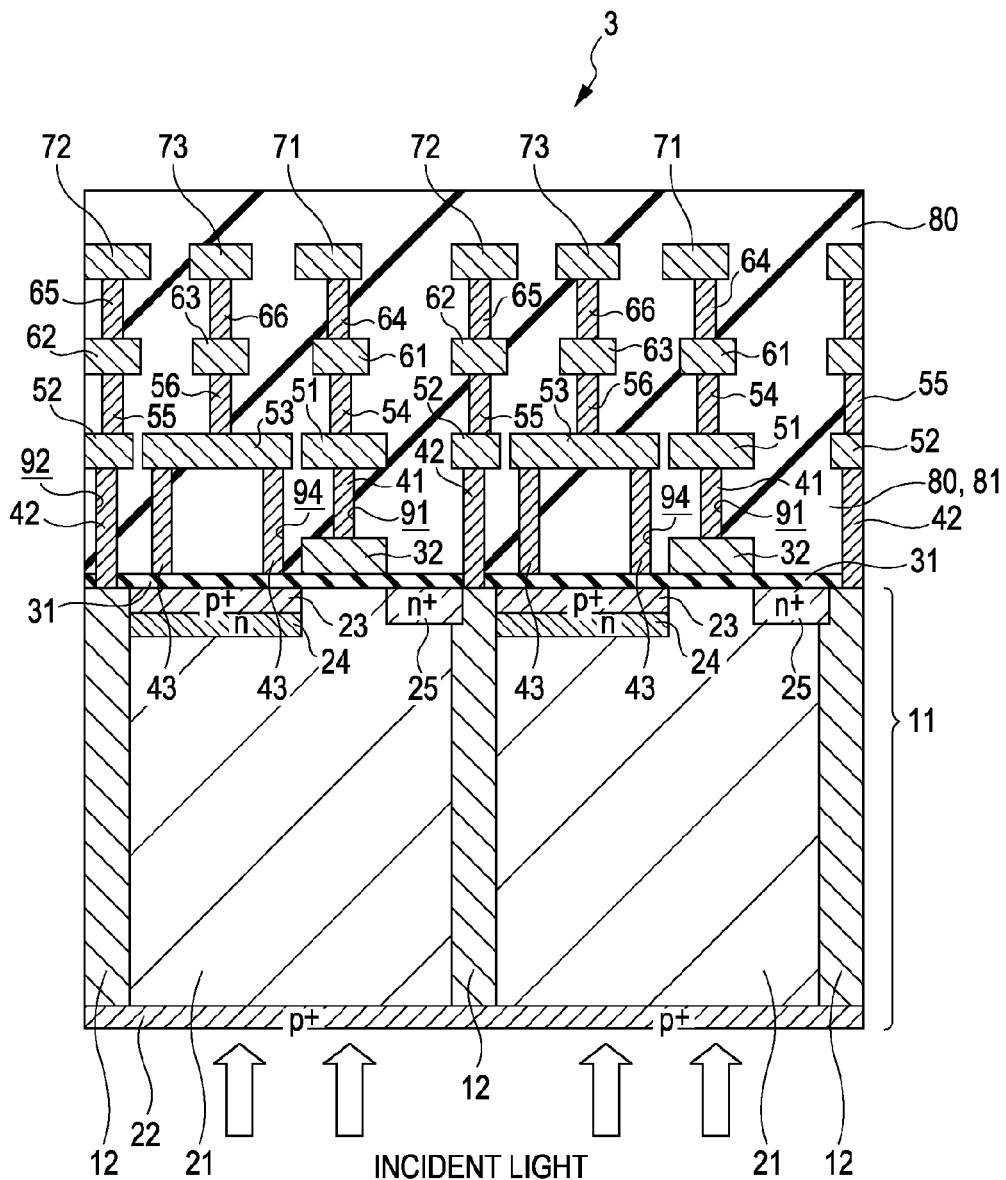
FIG. 3 is a schematic cross-sectional view of a solid-state imaging device according to an embodiment (third embodiment) of the present invention.
Figure 4A:
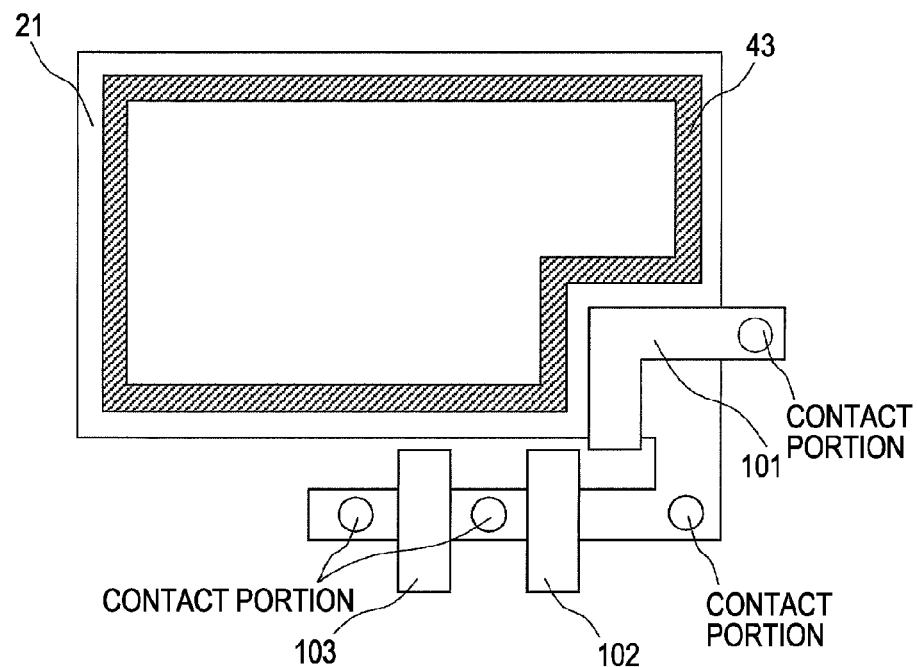
FIGS. 4A and 4B are layout plan views of the solid-state imaging device according to the embodiment (third embodiment) of the present invention.
Figure 4B:
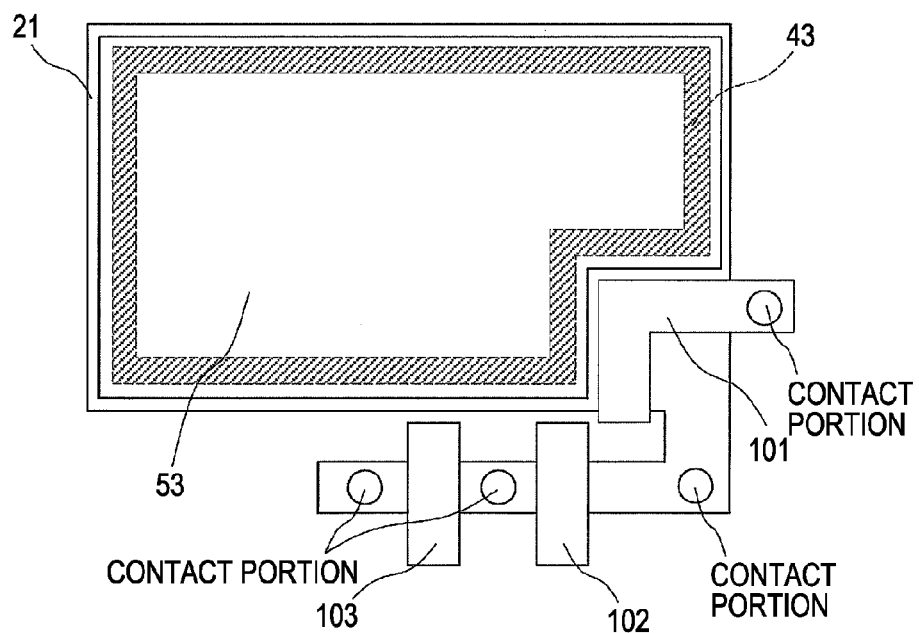

A solid-state imaging device 3 according to an embodiment (third embodiment) of the present invention will now be described with reference to FIGS. 3, 4A, and 4B. FIG. 3 is a schematic cross-sectional view of the solid-state imaging device 3. FIGS. 4A and 4B are layout plan views thereof.

Referring to FIGS. 3 to 4B, pixel isolation regions 12 for isolating a pixel are arranged in a semiconductor layer 11. The semiconductor layer 11 includes, for example, a silicon layer. Each pixel isolation region 12 includes, for example, a p-type well region. In each area partitioned by the pixel isolation regions 12, a photoelectric conversion section 21 is arranged.

On a first surface, through which light enters, of each photoelectric conversion section 21 (the lower surface of the photoelectric conversion section 21 in FIG. 3), i.e., in a first surface of the semiconductor layer 11 through which light enters the photoelectric conversion section 21, a hole storage layer 22 is arranged. The hole storage layer 22 includes, for example, a p+ region. A second surface of the photoelectric conversion section 21 (the upper surface of the photoelectric conversion section 21 in FIG. 3) opposite to the first surface thereof, i.e., a second surface of the semiconductor layer 11 opposite to the first surface thereof includes a hole storage layer 23. Under the hole storage layer 23, an n-type well region 24 is arranged. The hole storage layer 23 includes, for example, a p+ region. In addition, a gate electrode (for example, a transfer gate) 32 is arranged over the second surface of the photoelectric conversion section 21, with a gate insulation layer 31 therebetween. In the semiconductor layer 11, an n+ region 25 is arranged adjacent to one end of the gate electrode 32, with the gate insulation layer 31 therebetween.

A contact portion 41 is arranged on each gate electrode 32. Another contact portion 42 is arranged on each pixel isolation region 12. A reflective layer 43 formed simultaneously with the formation of the contact portions 41 and 42 is arranged over the periphery of each photoelectric conversion section 21, with the gate insulation layer 31 therebetween. In addition, contact portions connected to other transistors, for example, gate electrodes and source and drain regions in a signal circuit section (not shown) are arranged. The gate insulation layer 31 and the gate electrodes 32 are overlaid with an insulation layer 81. The above-described contact portions are formed by filling holes arranged in the insulation layer 81 with, for example, a conductive material. Referring to FIGS. 4A and 4B, a groove 94 to be filled with the conductive material to form the reflective layer 43 is arranged over the periphery of each photoelectric conversion section 21 so as to have a predetermined width. FIG. 4A illustrates the positional relationship between the photoelectric conversion section 21 and the reflective layer 43 formed in the groove 94. FIG. 4B illustrates the positional relationship among the photoelectric conversion section 21, the reflective layer 43 in the groove 94, and a first interconnection line 53.

The reflective layer 43 is composed of a material that reflects light transmitted through each photoelectric conversion section 21 toward the section 21. For example, the reflective layer 43 includes a material that reflects long-wavelength light components, e.g., at least near-infrared light and infrared light, toward the photoelectric conversion section 21. The reflective layer 43 may reflect shorter-wavelength light components, such as visible light, near-ultraviolet light, and ultraviolet light, in addition to the long-wavelength light components. Examples of the materials having the above-described characteristics include tungsten. It is therefore preferred that the reflective layer 43 be composed of a single tungsten layer. Alternatively, it is preferred that the reflective layer 43 be composed of a laminate containing a tungsten layer. Examples of the laminates include a laminate containing a polysilicon layer and a tungsten layer and a laminate containing a tungsten layer and a silicide layer. The reflective layer 43, which is formed by filling the groove 94, has to have a thickness sufficient to prevent long-wavelength light components, such as near-infrared light and infrared light, from being transmitted through the reflective layer 43.

Since the reflective layer 43 includes the tungsten layer, light transmitted through the photoelectric conversion section 21 can be reflected toward the photoelectric conversion section 21. The tungsten layer is formed without grain growth for an aluminum layer used in the related art. Accordingly, grain boundaries are hardly generated. Consequently, the reflective layer 43 can reflect long-wavelength light components, such as near-infrared light and infrared light, which leak from grain boundaries in the aluminum layer.

Further, first interconnection lines 51 to 53 respectively connected to the contact portions 41 and 42 and the reflective layer 43 are arranged. It is preferred that each first interconnection line 53 connected to the reflective layer 43 have a shape larger than, for example, the shape of the reflective layer 43 in plan view. Further, it is preferred that the first interconnection lines 51 and 52 be composed of, for example, a single tungsten layer or a laminate containing a tungsten layer. Since the first interconnection line 53 is composed of the single tungsten layer or the laminate containing the tungsten layer, long-wavelength light components transmitted through an area surrounded by the reflective layer 43 can be reflected toward the corresponding photoelectric conversion section 21. Furthermore, since the reflective layer 43 is arranged over the periphery of each photoelectric conversion section 21 and is connected to the first interconnection line 53, light components transmitted through the photoelectric conversion section 21 are reflected to the photoelectric conversion section 21 by the first interconnection line 53 and the reflective layer 43 without entering other pixels. Consequently, the light components transmitted through the photoelectric conversion section 21 can be allowed to again enter the photoelectric conversion section 21. In other words, since the light components transmitted through the photoelectric conversion section 21 is allowed to again enter the photoelectric conversion section 21 in the third embodiment, the first interconnection line 53 serves as a reflective layer.

The groove 94 in which the reflective layer 43 is formed is arranged so as not to overlap a transfer transistor 101 connected to the photoelectric conversion section 21. For example, the transfer transistor 101, a reset transistor 102, and an amplifier transistor 103 are connected to each photoelectric conversion section 21. In addition, the contact portion 41 connected to a transfer gate 101G of the transfer transistor 101 and contact portions connected to the sources and drains of the respective transistors are arranged.

Each first interconnection line 51 is connected to a second interconnection line 51 through a via hole 54. Each first interconnection line 52 is connected to a second interconnection line 62 through a via hole 55. Each first interconnection line 53 is connected to a second interconnection line 63 through a via hole 56. Similarly, each second interconnection line 61 is connected to a third interconnection line 71 through a via hole 64. Each second interconnection line 62 is connected to a third interconnection line 72 through a via hole 65. Each second interconnection line 63 is connected to a third interconnection line 73 through a via hole 66. The solid-state imaging device 3 of FIG. 3 includes an interconnection laminate having three interconnection layers. The present embodiment of the invention may be applied to a solid-state imaging device including an interconnection laminate having four or more interconnection layers. An insulation layer 80, including the insulation layer 81, is arranged so as to cover the above-described interconnection layers. The insulation layer 80 includes a plurality of insulation sublayers in accordance with the arrangement state of interconnection. The second surface of the semiconductor layer 11 is overlaid with the signal circuit section (not shown) which includes transistors, such as the transfer transistors 101, the reset transistors 102, and the amplifier transistors 103, and the interconnection laminate including the first interconnection lines 51 to 53, the via holes 54 to 56, the second interconnection lines 61 to 63, the via holes 64 to 66, and the third interconnection lines 71 to 73.

In the solid-state imaging device 3 according to the third embodiment, the reflective layer 43 and the first interconnection line 53 for reflecting light components transmitted through each photoelectric conversion section 21 toward the section 21 are arranged adjacent to the second surface of the photoelectric conversion section 21 opposite to the first surface thereof, i.e., the second surface of the semiconductor layer 11 opposite to the first surface thereof. If light entering the photoelectric conversion section 21 is not completely absorbed by the photoelectric conversion section 21, particularly, long-wavelength light components that are easily transmitted through each photoelectric conversion section 21, e.g., near-infrared light and infrared light can be reflected back to the photoelectric conversion section 21 by the reflective layer 43 and the first interconnection line 53. In other words, light transmitted once through the photoelectric conversion section 21 can be received again by the photoelectric conversion section 21. Consequently, the amount of, particularly, long-wavelength light components received by the photoelectric conversion section 21 is substantially increased. Thus, the sensitivity of the photoelectric conversion section 21 to long-wavelength light components can be improved. Since the reflective layer 43 and the first interconnection line 53 are each composed of the single tungsten layer or the laminate containing the tungsten layer, the density of each of the reflective layer 43 and the first interconnection line 53 is higher than that of an aluminum layer formed by grain growth. Accordingly, the reflective layer 43 and the first interconnection line 53 can reflect, in particular, long-wavelength light components, such as near-infrared light and infrared light. Furthermore, among light incident on the first surface of the semiconductor layer 11 (i.e., the first surface of the photoelectric conversion section 21), light components which are not absorbed by each photoelectric conversion section 21 are reflected back to the photoelectric conversion section 21 by the reflective layer 43 and the first interconnection line 53 included in the signal circuit section in the second surface of the semiconductor layer 11, thus preventing crosstalk caused by the leakage of light into surrounding pixels.

To make the solid-state imaging device 3 according to the third embodiment, the contact portion 41 is formed on each gate electrode 32 and the contact portion 42 is formed on each pixel isolation region 12. Simultaneously, the reflective layer 43, serving as a contact portion similar to those contact portions 41 and 42, may be formed over each photoelectric conversion section 21, with the gate insulation layer 31 therebetween. For example, holes 91 and 92 arranged in the insulation layer 81 are filled with tungsten to form the contact portions 41 and 42. Simultaneously, the groove 94 in the insulation layer 81 over each photoelectric conversion section 21 is filled with tungsten, thus forming the reflective layer 43. After that, the first interconnection line 53 connected to the reflective layer 43 is formed so as to cover the photoelectric conversion section 21 simultaneously with the formation of the first interconnection lines 51 and 52 connected to the contact portions 41 and 42, respectively.

A solid-state imaging device 4 according to an embodiment (fourth embodiment) of the present invention will now be described with reference to FIG. 5, which is a schematic cross-sectional view of the solid-state imaging device 4.

Figure 5:
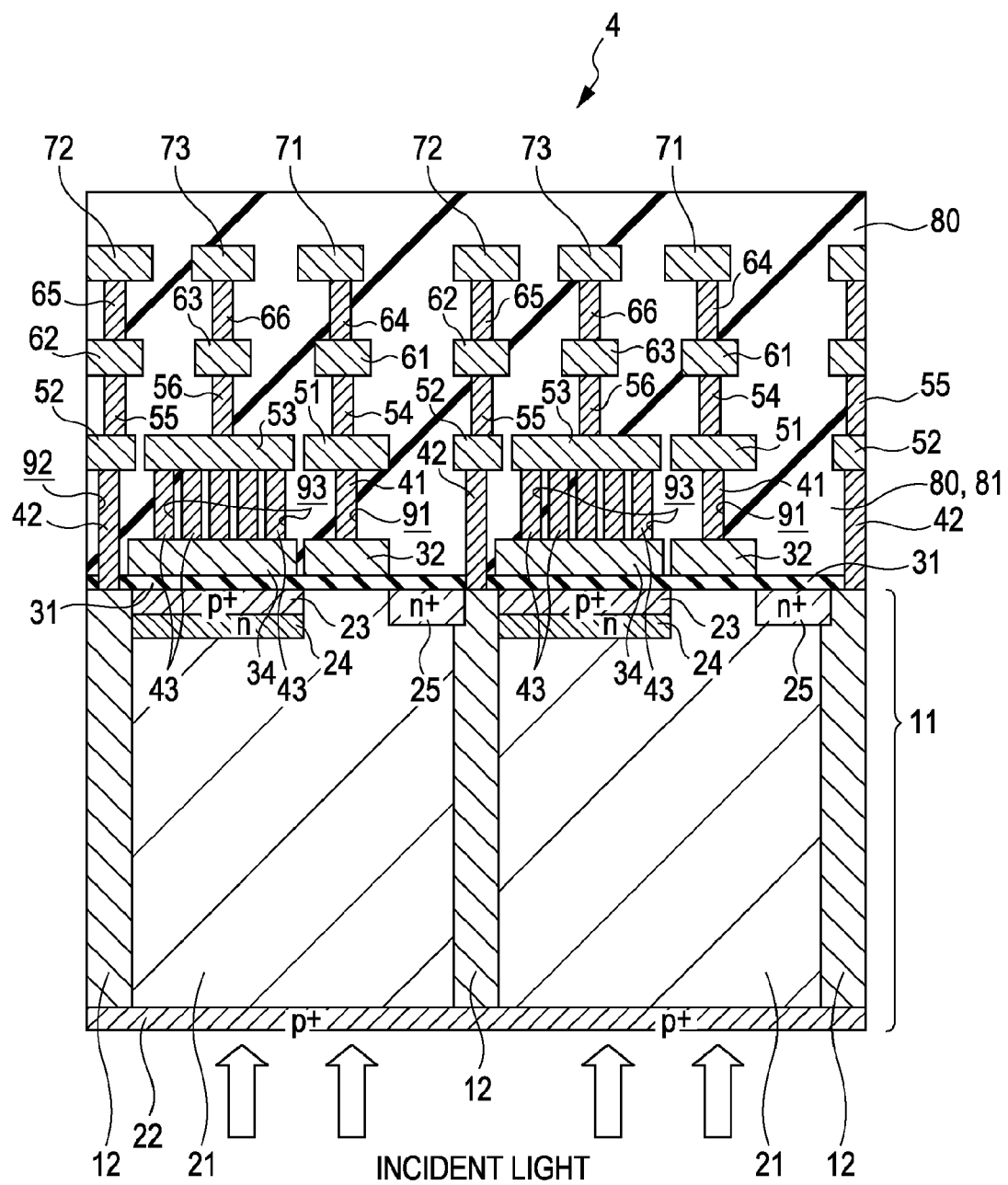
FIG. 5 is a schematic cross-sectional view of a solid-state imaging device according to an embodiment (fourth embodiment) of the present invention.

Referring to FIG. 5, pixel isolation regions 12 for isolating a pixel are arranged in a semiconductor layer 11. The semiconductor layer 11 includes, for example, a silicon layer.

Each pixel isolation region 12 includes, for example, a p-type well region. In each area partitioned by the pixel isolation regions 12, a photoelectric conversion section 21 is arranged. On a first surface, through which light enters, of each photoelectric conversion section 21 (the lower surface of the photoelectric conversion section 21 in FIG. 5), i.e., in a first surface of the semiconductor layer 11 through which light enters the photoelectric conversion section 21, a hole storage layer 22 is arranged. The hole storage layer 22 includes, for example, a p+ region. A second surface of the photoelectric conversion section 21 (the upper surface of the photoelectric conversion section 21 in FIG. 5) opposite to the first surface thereof, i.e., a second surface of the semiconductor layer 11 opposite to the first surface thereof includes a hole storage layer 23. Under the hole storage layer 23, an n-type well region 24 is arranged. The hole storage layer 23 includes, for example, a p+ region. In addition, a gate electrode (for example, a transfer gate) 32 is arranged over the second surface of the photoelectric conversion section 21, with a gate insulation layer 31 therebetween. In the semiconductor layer 11, an n+ region 25 is arranged adjacent to one end of the gate electrode 32, with the gate insulation layer 31 therebetween.

Further, an electrode layer 34 formed by the same layer as that for the gate electrode 32 is arranged over each photoelectric conversion section 21, with the gate insulation layer 31 therebetween. The electrode layer 34 is composed of, for example, polysilicon. Alternatively, the electrode layer 34 may be composed of polycide. A contact portion 41 is connected to each gate electrode 32, contact portions are connected to other transistors, for example, gate electrodes and source and drain regions in a signal circuit section (not shown), and a contact potion 42 is connected to each pixel isolation regions 12. In addition, a plurality of reflective layer segments 43, serving as contact portions, are arranged on the electrode layer 34. The reflective layer segments 43 are arranged as many as possible on the electrode layer 34. The reflective layer segments 43 are each composed of a material that reflects light transmitted through each photoelectric conversion section 21 toward the section 21. For example, the reflective layer segments 43 include a material that reflects long-wavelength light components, such as near-infrared light and infrared light, toward the photoelectric conversion section 21. The reflective layer segments 43 may reflect shorter-wavelength light components, such as visible light, near-ultraviolet light, and ultraviolet light, in addition to the long-wavelength light components. Examples of the materials having the above-described characteristics include tungsten. It is therefore preferred that the reflective layer segments 43 be composed of a single tungsten layer. Alternatively, it is preferred that the reflective layer segments 43 be composed of a laminate containing a tungsten layer. The reflective layer segments 43 on the electrode layer 34 are arranged so that the distance between the neighboring segments is minimized in accordance with the design rule and the diameter of each reflective layer segment 43 is maximized in accordance with the design rule. In other words, the reflective layer segments 43 are arranged so that the total area occupied by the reflective layer segments 43 on the electrode layer 34 is maximized.

Further, first interconnection lines 51 to 53 respectively connected to the contact portions 41 and 42 and the reflective layer segments 43 are arranged. It is preferred that each first interconnection line 53 connected to the reflective layer segments 43 have a shape similar to or larger than that of the electrode layer 34. Further, the first interconnection lines 51 and 52 are composed of, for example, a single tungsten layer or a laminate containing a tungsten layer. Since the first interconnection line 53 is formed by the single tungsten layer or the laminate containing the tungsten layer, long-wavelength light components transmitted through each portion between the reflective layer segments 43 can be reflected toward the corresponding photoelectric conversion section 21. Furthermore, since light transmitted through each photoelectric conversion section 21 is reflected toward the section 21 by the first interconnection line 53 and the reflective layer segments 43, the amount of light entering other pixels can be reduced and the reflected light can be allowed to again enter the photoelectric conversion section 21. In other words, since light transmitted through the photoelectric conversion section 21 is allowed to again enter the photoelectric conversion section 21 in accordance with the fourth embodiment, the first interconnection line 53 also serves as a reflective layer.

Each first interconnection line 51 is connected to a second interconnection line 51 through a via hole 54. Each first interconnection line 52 is connected to a second interconnection line 62 through a via hole 55. Each first interconnection line 53 is connected to a second interconnection line 63 through a via hole 56. Similarly, each second interconnection line 61 is connected to a third interconnection line 71 through a via hole 64. Each second interconnection line 62 is connected to a third interconnection line 72 through a via hole 65. Each second interconnection line 63 is connected to a third interconnection line 73 through a via hole 66. The solid-state imaging device 4 of FIG. 5 includes an interconnection laminate having three interconnection layers. The present embodiment of the invention may be applied to a solid-state imaging device including an interconnection laminate having four or more interconnection layers. An insulation layer 81 is arranged so as to cover the above-described interconnection layers. The insulation layer 81 includes a plurality of insulation sublayers in accordance with the arrangement state of interconnection. The second surface of the semiconductor layer 11 is overlaid with the signal circuit section (not shown) which includes transistors, such as transfer transistors, reset transistors, and amplifier transistors, and the interconnection laminate including the first interconnection lines 51 to 53, the via holes 54 to 56, the second interconnection lines 61 to 63, the via holes 64 to 66, and the third interconnection lines 71 to 73.

In the solid-state imaging device 4 according to the fourth embodiment, the reflective layer segments 43 for reflecting light transmitted through each photoelectric conversion section 21 toward the section 21 are arranged adjacent to the second surface of the photoelectric conversion section 21 opposite to the first surface thereof, i.e., the second surface of the semiconductor layer 11 opposite to the first surface thereof. If light entering the photoelectric conversion section 21 is not completely absorbed by the photoelectric conversion section 21, particularly, long-wavelength light components that are easily transmitted through each photoelectric conversion section 21, e.g., near-infrared light and infrared light can be reflected back to the photoelectric conversion section 21 by the reflective layer segments 43. In other words, light transmitted once through the photoelectric conversion section 21 can be received again by the photoelectric conversion section 21. Consequently, the amount of, particularly, long-wavelength light components received by the photoelectric conversion section 21 is substantially increased. Thus, the sensitivity of the photoelectric conversion section 21 to long-wavelength light components can be improved. Since the reflective layer segments 4 are composed of the single tungsten layer or the laminate containing the tungsten layer, the density of each reflective layer segment 43 is higher than that of an aluminum layer formed by grain growth. Accordingly, the reflective layer segments 43 can reflect, in particular, long-wavelength light components, such as near-infrared light and infrared light. Furthermore, among light incident on the first surface of the semiconductor layer 11 (i.e., the first surface of the photoelectric conversion section 21), light components which are not absorbed by each photoelectric conversion section 21 are reflected back to the photoelectric conversion section 21 by the reflective layer segments 43 adjacent included in the signal circuit section in the second surface of the semiconductor layer 11, thus preventing crosstalk caused by the leakage of light into surrounding pixels.

In addition, applying a bias voltage to the electrode layer 34 enables the potential of a charge storage portion in the photoelectric conversion section 21 to vary. In current CMOS image sensors, the potential depth of the charge storage portion has to be designed so that signal charge is completely transferred upon reading the signal charge without leaving the signal charge to be read, that is, without any image lag. According to the present embodiment of the invention, when signal charge is read out, a bias voltage is applied to make the potential depth of the charge storage portion shallower, thus maintaining the enough potential depth of the charge storage portion while keeping the readout efficiency constant. Consequently, the amount of saturation charge can be increased.

Since the electrode layer 34, to which a bias voltage can be applied, is arranged over each photoelectric conversion section 21, this arrangement serves as a countermeasure against pinning. If the electrode layer 34 is made of polysilicon, the electrode layer 34 has an insufficient function as a reflective layer. According to the present embodiment, however, the reflective layer segments 43, each of which has a structure similar to a contact portion and is made of tungsten, are arranged on the electrode layer 34. Therefore, the reflecting efficiency can be ensured.

To make the solid-state imaging device 4 according to the fourth embodiment, in the step of forming the gate electrode 32 over each photoelectric conversion section 21, the electrode layer 34 is formed on the gate insulation layer 31 over the photoelectric conversion section 21. In other words, when the gate electrodes of transistors, such as the transfer transistor, the reset transistor, and the amplifier transistor, are formed, the electrode layer 34 is also formed. Further, when the contact portion 41 is formed on the gate electrode 32 and the contact portion 42 is formed on the pixel isolation regions 12, the reflective layer segments 43 including the contact portions similar to the contact portions 41 and 42 may be formed on the electrode layer 34. For example, holes 91 and 92 arranged in the insulation layer 81 are filled with tungsten to form the contact portions 41 and 42. Simultaneously, a plurality of holes 93 in the insulation layer 81 over each photoelectric conversion section 21 are filled with tungsten, thus forming the reflective layer segments 43. At that time, the reflective layer segments 43 are formed on the electrode layer 34 so that the distance between neighboring segments is minimized in accordance with the design rule and the diameter of each segment is maximized. In other words, the reflective layer segments 43 are formed so that the total area occupied by the reflective layer segments 43 on the electrode layer 34 is maximized.

A solid-state imaging device 5 according to an embodiment (fifth embodiment) of the present invention will now be described with reference to FIG. 6, which is a schematic cross-sectional view of the solid-state imaging device 5.

Figure 6:
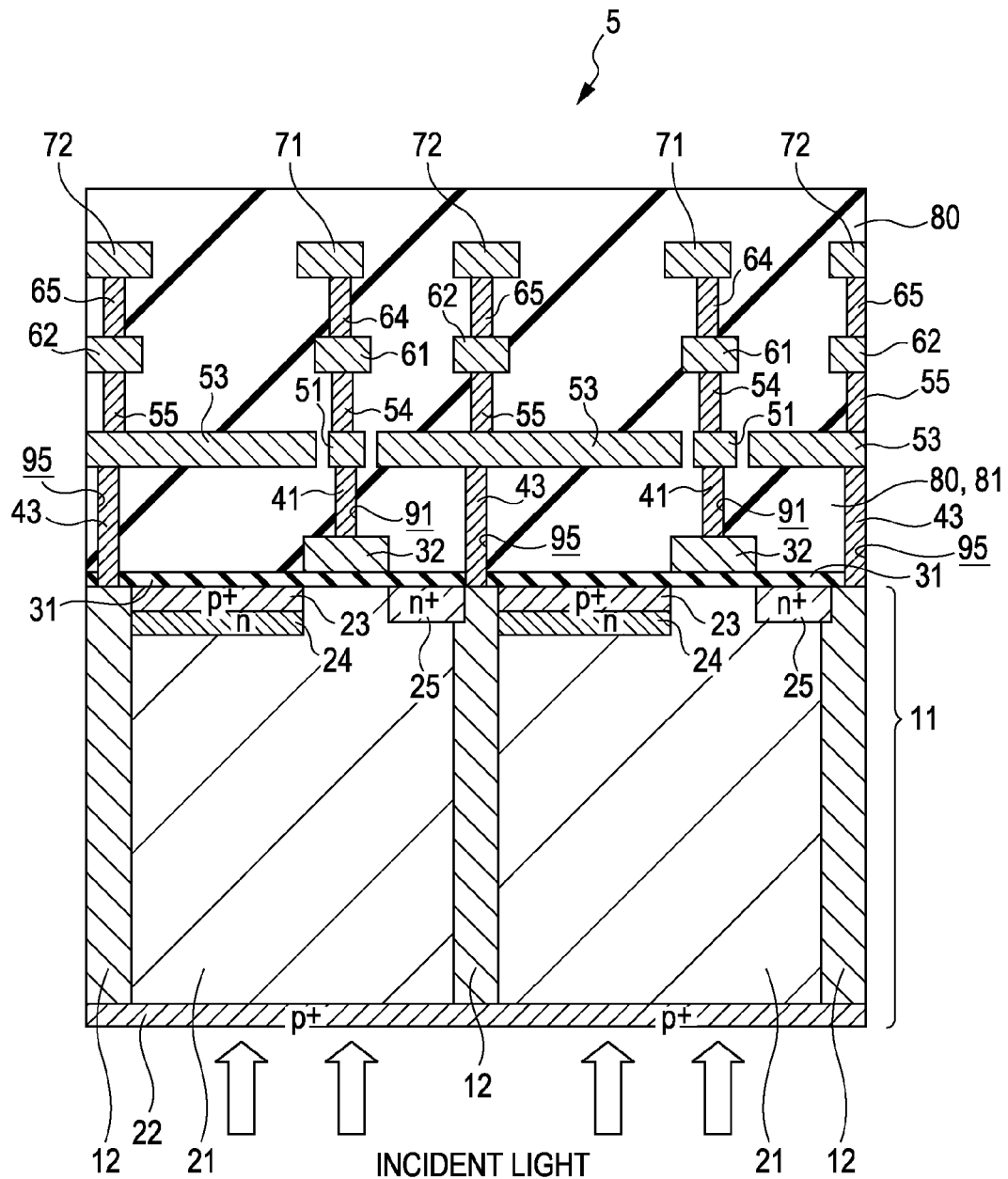
FIG. 6 is a schematic cross-sectional view of a solid-state imaging device according to an embodiment (fifth embodiment) of the present invention.

Referring to FIG. 6, pixel isolation regions 12 for isolating a pixel are arranged in a semiconductor layer 11. The semiconductor layer 11 includes, for example, a silicon layer. Each pixel isolation region 12 includes, for example, a p-type well region. In each area partitioned by the pixel isolation regions 12, a photoelectric conversion section 21 is arranged. On a first surface, through which light enters, of each photoelectric conversion section 21 (the lower surface of the photoelectric conversion section 21 in FIG. 6), i.e., in a first surface of the semiconductor layer 11 through which light enters the photoelectric conversion section 21, a hole storage layer 22 is arranged. The hole storage layer 22 includes, for example, a p+ region. A second surface of the photoelectric conversion section 21 (the upper surface of the photoelectric conversion section 21 in FIG. 6) opposite to the first surface thereof, i.e., a second surface of the semiconductor layer 11 opposite to the first surface thereof includes a hole storage layer 23. Under the hole storage layer 23, an n-type well region 24 is arranged. The hole storage layer 23 includes, for example, a p+ region. Further, a gate electrode (for example, a transfer gate) 32 is arranged over the second surface of the photoelectric conversion section 21, with a gate insulation layer 31 therebetween. In the semiconductor layer 11, an n+ region 25 is arranged adjacent to one end of each gate electrode 32, with the gate insulation layer 31 therebetween.

A contact portion 41 is arranged on each gate electrode 32. A reflective layer 43, formed by filling a groove 95 arranged so as to surround the periphery of each photoelectric conversion section 21, is arranged on each pixel isolation regions 12. In addition, contact portions connected to other transistors, e.g., gate electrodes and source and drain regions in a signal circuit section (not shown) are arranged. The gate insulation layer 31 and the gate electrodes 32 are overlaid with an insulation layer 81. The respective contact portions and the reflective layer 43 are formed by filling holes and the groove 95 arranged in the insulation layer 81 with, for example, a conductive material.

The reflective layer 43 is made of a material that reflects light transmitted through each photoelectric conversion sections 21 toward the section 21. For example, the reflective layer 43 includes a material that reflects long-wavelength light components, e.g., at least near-infrared light and infrared light components toward the photoelectric conversion section 21. The reflective layer 43 may reflect shorter-wavelength light components, such as visible light, near-ultraviolet light, and ultraviolet light, in addition to the long-wavelength light components. Examples of the materials having the above-described characteristics include tungsten. It is therefore preferred that the reflective layer 43 be composed of a single tungsten layer. Alternatively, it is preferred that the reflective layer 43 be composed of a laminate containing a tungsten layer. Examples of the laminates include a laminate containing a polysilicon layer and a tungsten layer and a laminate containing a tungsten layer and a silicide layer. The reflective layer 43 obtained by filling the groove 95 has to have a thickness sufficient to prevent long-wavelength light components, such as near-infrared light and infrared light, from being transmitted through the reflective layer 43.

Since the reflective layer 43 includes the tungsten layer, light transmitted through the photoelectric conversion section 21 can be reflected toward the photoelectric conversion section 21. The tungsten layer is formed without grain growth for an aluminum layer used in the related art. Accordingly, grain boundaries are hardly generated. Consequently, the reflective layer 43 can reflect long-wavelength light components, such as near-infrared light and infrared light, which leak from grain boundaries in the aluminum layer.

Further, first interconnection lines 51 are connected to the contact portions 41 and first interconnection lines 53 are connected to the reflective layer 43. It is preferred that each first interconnection line 53 connected to the reflective layer 43 have a shape similar to or larger than that of the reflective layer 43 surrounding the photoelectric conversion section 21. Further, the first interconnection lines 51 and 53 are composed of a single tungsten layer or a laminate containing a tungsten layer. Since each first interconnection line 53 is formed using the single tungsten layer or the laminate containing the tungsten layer, long-wavelength light components transmitted through an area surrounding the reflective layer 43 can be reflected toward the photoelectric conversion section 21. Since the reflective layer 43 is arranged so as to surround the periphery of each photoelectric conversion section 21 and is connected to the first interconnection lines 53, light transmitted through the photoelectric conversion section 21 are reflected toward the photoelectric conversion section 21 by the first interconnection lines 53 and the reflective layer 43. The reflected light components can be allowed to again enter the photoelectric conversion section 21 without entering other pixels. In other words, since the first interconnection lines 53 each have a function of allowing light transmitted through the photoelectric conversion sections 21 to again enter the photoelectric conversion sections 21, each first interconnection line 53 also serves as a reflective layer.

The first interconnection lines 51 and 53 are connected to second interconnection lines 61 and 62 through via holes 54 and 55, respectively. Similarly, the second interconnection lines 61 and 62 are connected to third interconnection lines 71 and 72 through via holes 64 and 65, respectively. The solid-state imaging device 5 of FIG. 6 includes an interconnection laminate having three interconnection layers. The present embodiment of the invention may be applied to a solid-state imaging device including an interconnection laminate having four or more interconnection layers. An insulation layer 80, including the insulation layer 81, is arranged so as to cover the above-described interconnection layers. The insulation layer 80 includes a plurality of insulation sublayers in accordance with the arrangement state of interconnection. The second surface of the semiconductor layer 11 is overlaid with the signal circuit section (not shown) which includes transistors, such as transfer transistors, reset transistors, and amplifier transistors, and the interconnection laminate including the first interconnection lines 51 and 53, the via holes 54 and 55, the second interconnection lines 61 and 62, the via holes 64 and 65, and the third interconnection lines 71 and 72.

In the solid-state imaging device 5 according to the fifth embodiment, the reflective layer 43 and the first interconnection lines 53 for reflecting light transmitted through each photoelectric conversion section 21 toward the section 21 are arranged adjacent to the second surface of the photoelectric conversion section 21 opposite to the first surface thereof, i.e., the second surface of the semiconductor layer 11 opposite to the first surface thereof. If light entering the photoelectric conversion section 21 is not completely absorbed by the photoelectric conversion section 21, particularly, long-wavelength light components that are easily transmitted through each photoelectric conversion section 21, e.g., near-infrared light and infrared light can be reflected back to the photoelectric conversion section 21 by the reflective layer 43 and the first interconnection lines 53. In other words, light transmitted once through the photoelectric conversion section 21 can be received again by the photoelectric conversion section 21. Consequently, the amount of, particularly, long-wavelength light components received by the photoelectric conversion section 21 is substantially increased. Thus, the sensitivity of the photoelectric conversion section 21 to long-wavelength light components can be improved. Since the reflective layer 43 and the first interconnection line 53 are each composed of the single tungsten layer or the laminate containing the tungsten layer, the density of each of the reflective layer 43 and the first interconnection lines 53 is higher than that of an aluminum layer obtained by grain growth. Accordingly, the reflective layer 43 and the first interconnection lines 53 can reflect, in particular, long-wavelength light components, such as near-infrared light and infrared light. Furthermore, among light incident on the first surface of the semiconductor layer 11 (i.e., the first surface of the photoelectric conversion section 21), light components which are not absorbed by each photoelectric conversion section 21 are reflected back to the photoelectric conversion section 21 by the reflective layer 43 and the first interconnection lines 53 included in the signal circuit section in the second surface of the semiconductor layer 11, thus preventing crosstalk caused by the leakage of light into surrounding pixels.

To make the solid-state imaging device 5 according to the fifth embodiment, when the contact portion 41 is formed on each gate electrode 32, the reflective layer 43, serving as a contact portion, may be formed on each pixel isolation region 12 in a manner similar to the contact portion 41 on the gate electrode 32. For example, a hole 91 in the insulation layer 81 is filled with tungsten to form the contact portion 41. Simultaneously, the groove 95 in the insulation layer 81 on each pixel isolation region 12 is filled with tungsten, thus forming the reflective layer 43. Subsequently, the first interconnection lines 53 are arranged so as to be connected to the reflective layer 43 over the photoelectric conversion section 21 simultaneously with forming the first interconnection lines 51 so as to be connected to the contact portions 41.

In each of the above-described solid-state imaging devices 1 to 5, the reflective layer (or reflective layer segment) 43 is made of tungsten. The reflective layer 43 may be composed of a laminate containing a tungsten layer underlaid with a silicide layer or a laminate containing a tungsten layer underlaid with a polysilicon layer. In the use of this laminate structure, the silicide or polysilicon layer can prevent processing damage on an underlying layer, the damage being caused by processing using tungsten.

An imaging apparatus 200 according to an embodiment (application) of the present invention will now be described with reference to FIG. 7, which is a block diagram of the imaging apparatus 200.

Figure 7:
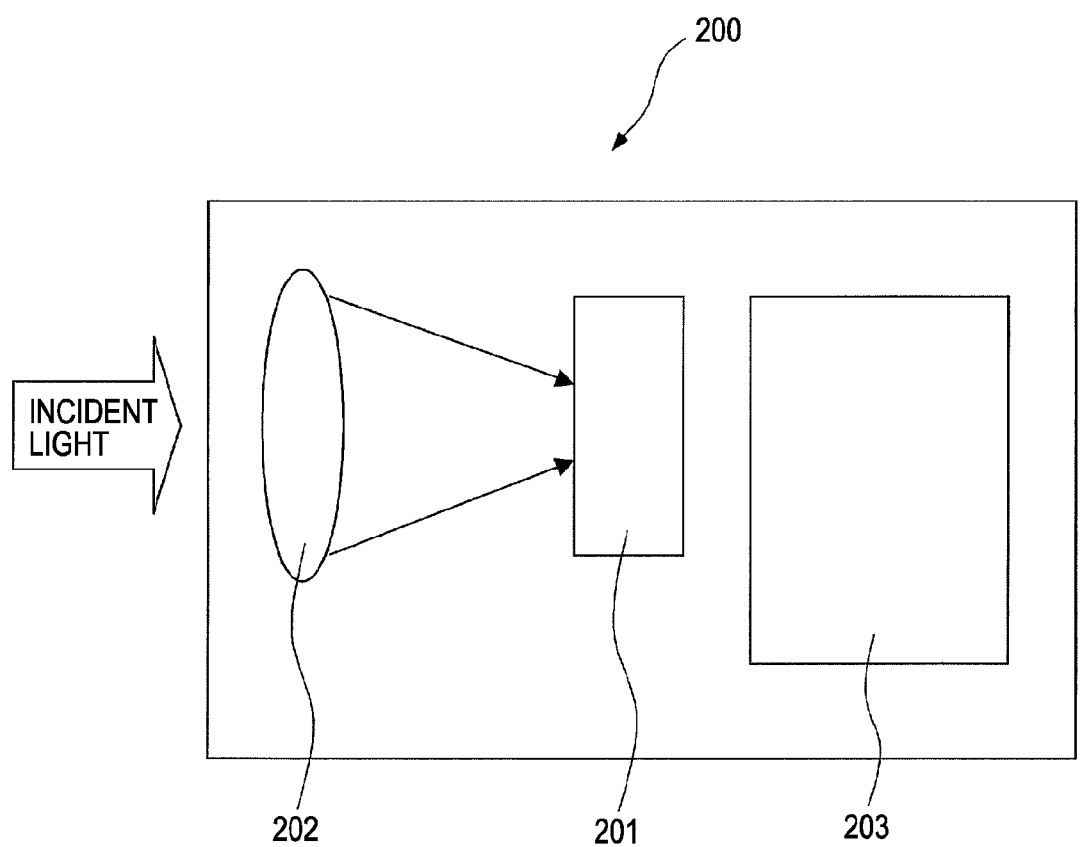
FIG. 7 is a block diagram illustrating an imaging apparatus according to an embodiment (application) of the present invention.
Figure 8:
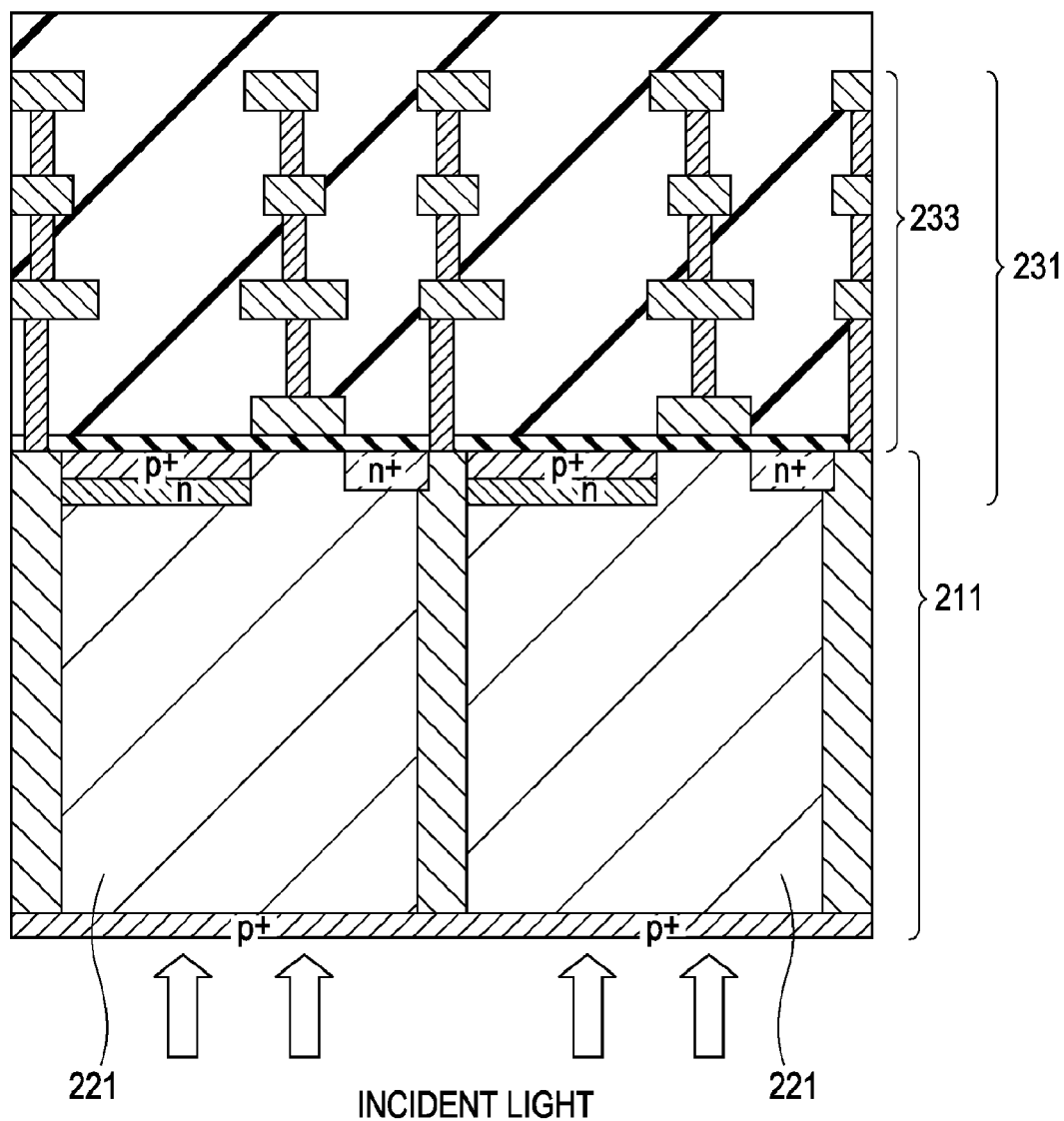
FIG. 8 is a schematic cross-sectional view of a related-art solid-state imaging device.

Referring to FIG. 7, the imaging apparatus 200 includes an imaging unit 201 that includes a solid-state imaging device (not shown). The imaging apparatus 200 further includes an imaging optical system 202 for image formation. The imaging optical system 202 is arranged on the light collection side upstream of the imaging unit 201. The imaging unit 201 is connected to a signal processing unit 203, which includes a driving circuit for driving the imaging unit 201 and a signal processing circuit for processing signals, obtained by photoelectric conversion by the solid-state imaging device, to generate image signals. The image signals obtained by the signal processing unit 203 can be stored in an image storage unit (not shown). The imaging apparatus 200 may include any of the solid-state imaging devices 1 to 5 described in the foregoing embodiments.

Since the imaging apparatus 200 according to the present embodiment includes any of the solid-state imaging devices 1 to 5 according to the foregoing embodiments, the photoelectric conversion section in each pixel can have an enough area as described above. Advantageously, the characteristics of each pixel, e.g., the sensitivity can be improved.

The structure of the imaging apparatus 200 according to the present embodiment is not limited to the above-described structure. The present embodiment of the invention may be applied to any imaging apparatus including a solid-state imaging device.

Each of the above-described solid-state imaging devices 1 to 5 may be implemented as a single chip or a module having an imaging function achieved by the imaging unit, the signal processing unit, and the optical system which are integrated into a single package. The present invention can be applied not only to a solid-state imaging device, but also to an imaging apparatus. In this case, the imaging apparatus having high image quality can be provided. In this instance, the "imaging apparatus" means a portable device having, for example, a camera or an imaging function. The term "imaging" includes not only image capture in a typical camera shooting mode but also fingerprint detection in a broad sense.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    a photoelectric conversion section having oppositely facing first and second sides, the first side being configured to receive light;
    a hole accumulation layer arranged over the second side;
    a gate electrode arranged over the second side;
    a reflective layer arranged over the second side, the reflective layer reflecting light transmitted through the photoelectric conversion section back thereto; and
    a first interconnect line arranged over the second side, facing the hole accumulation layer, the first interconnect line being in contact with the reflective layer,
    wherein,
        the reflective layer is composed of a single tungsten layer or a laminate containing a tungsten layer, and
        the reflective layer is arranged between the interconnect line and the hole accumulation layer.

2. The device according to claim 1, further comprising a polysilicon electrode layer over the hole accumulation layer.

3. The device according to claim 2, wherein a bias voltage is applied to the polysilicon electrode layer through the reflective layer.

4. The device according to claim 1, wherein the reflective layer is arranged over a periphery of the photoelectric conversion section.

5. The device according to claim 4, wherein:
    the first interconnection layer has a function of reflecting light transmitted through the photoelectric conversion section back thereto, and
    the first interconnection layer is composed of a single tungsten layer or a laminate containing a tungsten layer.

6. The device according to claim 1, wherein the reflective layer is formed by filling a hole in the insulating layer over the photoelectric conversion section.

7. The device according to claim 1, wherein the reflective layer is arranged on at least the inner surface of a hole in the insulating layer over the photoelectric conversion section.

8. An imaging apparatus comprising:
    a collection optical unit that collects incident light;
    a solid-state imaging device that receives the light collected by the collection optical unit and converts the light into an electrical signal; and
    a signal processing unit that processes the electrical signal,
    wherein,
        the solid-state imaging device includes (a) a photoelectric conversion section having oppositely facing first and second sides, the first side being configured to receive light, (b) a hole accumulation layer arranged over the second side, (c) a gate electrode arranged over the second side, (d) a reflective layer arranged over the second side, the reflective layer reflecting light transmitted through the photoelectric conversion section back thereto, and (e) a first interconnect line arranged over the second side, facing the hole accumulation layer, the first interconnect line being in contact with the reflective layer,
    wherein,
        the reflective layer is composed of a single tungsten layer or a laminate containing a tungsten layer, and
        the reflective layer is arranged between the interconnect line and the hole accumulation layer.

9. The imaging apparatus according to claim 8, wherein:
    the interconnection layer extending over the photoelectric conversion section has a function of reflecting light transmitted through the photoelectric conversion section back thereto; and
    the interconnection layer is composed of a single tungsten layer or a laminate containing a tungsten layer.

* * * * *